United States Patent [19]
Boudewijns

[11] Patent Number: 4,903,241
[45] Date of Patent: Feb. 20, 1990

[54] READ CIRCUIT HAVING A LIMITED-BANDWIDTH AMPLIFIER FOR HOLDING THE OUTPUT OF A DELAY CIRCUIT

[75] Inventor: Arnoldus J. J. Boudewijns, Eindhoven, Netherlands

[73] Assignee: U.S. Philips Corporation, New York, N.Y.

[21] Appl. No.: 253,539

[22] Filed: Oct. 5, 1988

[30] Foreign Application Priority Data

Oct. 12, 1987 [NL] Netherlands ............... 8702425

[51] Int. Cl.⁴ ............................................. G11C 7/00
[52] U.S. Cl. ................................. 365/194; 365/149; 365/189.05; 365/191; 365/189.06; 307/243; 307/601
[58] Field of Search ............... 365/194, 191, 189.05, 365/189.06, 222; 307/479, 601, 603, 242, 243, 596, 279, 272.1, 530

[56] References Cited

U.S. PATENT DOCUMENTS

| | | | |
|---|---|---|---|
| 4,490,626 | 12/1984 | Carlson | 307/243 |
| 4,546,273 | 10/1985 | Osman | 365/222 |
| 4,651,027 | 3/1987 | Herzl | 307/479 |
| 4,679,168 | 7/1987 | Conway et al. | 365/194 |
| 4,710,654 | 12/1987 | Saitoh et al. | 307/601 |
| 4,712,203 | 12/1987 | Saito et al. | 365/122 |
| 4,716,548 | 12/1987 | Mochizuki | 365/149 |
| 4,760,346 | 7/1988 | Kultgen et al. | 307/243 |
| 4,775,914 | 10/1988 | Incardona | 361/190 X |
| 4,797,576 | 1/1989 | Asazawa | 307/272.1 |
| 4,814,640 | 3/1989 | Miyake | 307/242 |

FOREIGN PATENT DOCUMENTS

| | | | |
|---|---|---|---|
| 0017343 | 10/1980 | European Pat. Off. | |
| 0087707 | 9/1983 | European Pat. Off. | 307/601 |
| 60-117914 | 6/1985 | Japan | 307/601 |

OTHER PUBLICATIONS

Transport Delay Simulation, by K. Soe Hojberg, Instruments & Control Systems, Jun. 1966, p. 165.
Variable Electronic Allpass Delay Networks by R. K. P. Galpin, Electronics Letters, 4, NR 7, Apr. 5, 1968, pp. 137-139.
Technology Update, 8029 Electronic Engineering 50 (1985) Jul., No. 703, London, Great Britain, p. 25.
Fernseh-Und Kino-Technick, 30, Jahrgang, No. 3, pp. 81-85, by G. Brand.

Primary Examiner—Stuart N. Hecker
Assistant Examiner—Alfonso Garcia
Attorney, Agent, or Firm—Edward W. Goodman

[57] ABSTRACT

An amplifier (63) at the output (41) of a delay circuit (3) comprising capacitive memory elements (5, 7, 9, 11) which can be successively written and successively read in a manner which is delayed with respect to the writing sequence is formed as a differential amplifier having a special negative feedback (73, 75) and a double sampling circuit (55, 57) at its two inputs (61, 65) to obtain a sufficiently high output voltage and to serve as a hold circuit so that no stringent requirement need to be imposed on the bandwidth of the amplifier.

2 Claims, 1 Drawing Sheet

READ CIRCUIT HAVING A LIMITED-BANDWIDTH AMPLIFIER FOR HOLDING THE OUTPUT OF A DELAY CIRCUIT

BACKGROUND OF THE INVENTION

1. Field of the Invention

The invention relates to a read circuit for a delay circuit for successively reading a plurality of capacitive memory elements of the delay circuit, said reading being delayed with respect to the successive writing of said memory elements and being performed by means of an amplifier an input of which is coupled to an output of the delay circuit.

2. Description of Related Art

A read circuit of the type described above is known from Fernseh-und Kinotechnik 1976, number 3, pages 81-85, particularly FIGS. 5 and 6.

The amplifier of this citation receives a signal which is alternately produced by a relevant capacitive memory element to be read and by a short-circuit arrangement. Due to the output capacitance of the delay circuit and the input capacitance of the amplifier, this signal has a small amplitude and the amplifier must have a large gain at a large bandwidth, while the spread in the elements of the circuit makes it difficult to obtain, without adjustment, a given signal level at the output of the read circuit as is, for example, required if the output signal of the read circuit must have a defined ratio with respect to the input signal of the delay circuit. The latter is the case, for example, when the delay circuit is incorporated in a comb filter circuit for eliminating disturbing phenomena in a video signal.

SUMMARY OF THE INVENTION

It is an object of the invention to provide a read circuit which does not impose stringent requirements on the amplifier circuit and which does not need to be adjusted to obtain a given ratio between the levels of the signals at the output of the read circuit and at the input of the delay circuit.

To this end a delay circuit of the type described in the opening paragraph is characterized in that the amplifier has a second input constituting a difference signal input with respect to the first-mentioned input, while the first-mentioned input and the second input are coupled via a sampling circuit to the output of the delay circuit and to an impedance, respectively, which is identical to the output impedance of the delay circuit, and the output of the amplifier is coupled via a negative feedback impedance to the second input so that in the operative state of the sampling circuit, the negative feedback impedance ensures a voltage division from the output of the amplifier to the input impedance of its second input during reading of a memory element, said voltage division being identical to the voltage division produced by the series circuit of the impedance of a memory element to be read and the parallel circuit of the output impedance of the delay circuit and the input impedance of the first-mentioned input, so that during reading, the voltage at the output of the amplifier becomes substantially equal to the unloaded voltage at the relevant memory element and the amplifier serves as a hold circuit when the sampling circuit is inoperative.

Since the amplifier circuit now serves as a hold circuit and thus need not pass on a discharge cycle of the output capacitance of the delay circuit, its bandwidth may be accordingly smaller, while its gain is determined by an impedance ratio which, in an integrated circuit, is only dependent on the ratio of the dimensions of circuit elements, which ratio can be made very accurately, independently of the manufacturing process.

BRIEF DESCRIPTION OF THE DRAWING

The invention will now be described in greater detail, by way of example, with reference to the accompanying drawing, in which.

DESCRIPTION OF THE PREFERRED EMBODIMENT

Figure 1:
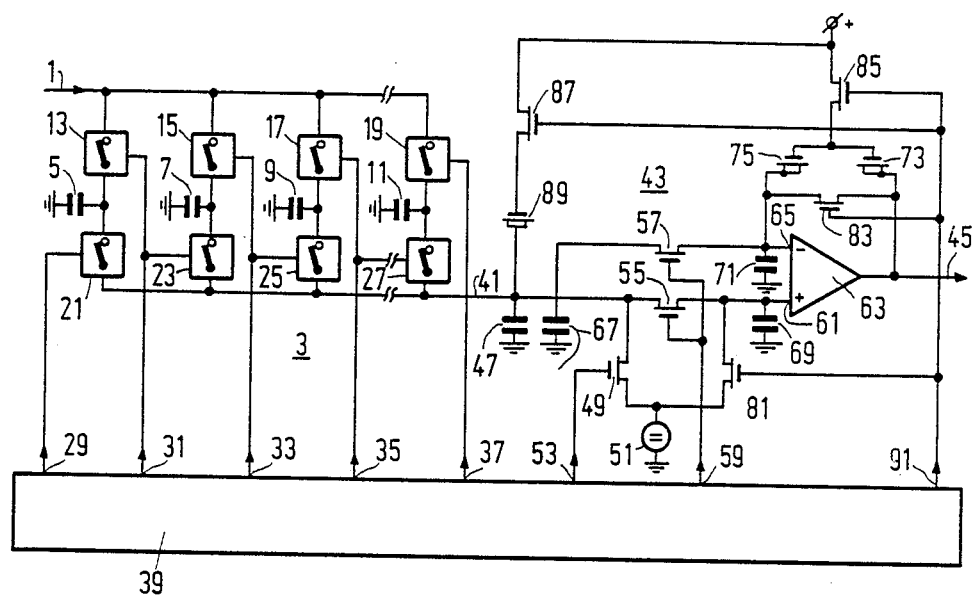
FIG. 1 is a concise circuit diagram of an embodiment of a read circuit according to the invention.

In FIG. 1 a signal to be delayed, for example, a video signal to be delayed by one line period, is applied to an input 1 of a delay circuit 3.

The delay circuit 3 comprises a plurality of capacitive memory elements 5, 7, 9, 11 which are successively written with video signal samples by closing write switches 13, 15, 17, 19, respectively, for a short time, which samples represent an amplitude of the video signal occurring at the instant of closing the relevant write switch.

After a given delay period, in this case one line period, the capacitive memory elements are successively read by closing read switches 21, 23, 25, 27, respectively, for a short time.

The write and read switches 13, 15, 17, 19, 21, 23, 25, 27 are operated by switching signals from a plurality of outputs 29, 31, 33, 35, 37 of a pulse generator 39.

The delayed video signal samples from the read switches 21, 23, 25, 27 are applied to an output 45 of a read circuit 43 via an output 41 of the delay circuit 3 and the read circuit 43.

The output 41 of the delay circuit 3 has an output impedance which is substantially capacitive and which is represented by a capacitor 47. In the intervals between the successive closing periods of the read switches 21, 23, 25, 27 the capacitor 47 is each time connected via a switching transistor 49 to a reference voltage source 51 and is each time discharged thereby. The switching transistor 49 is operated by a switching signal from an output 53 of the pulse generator 39.

During the closing period of each read switch 21, 23, 25, 27 a sampling circuit is rendered operative, which sampling circuit comprises two switching transistors 55, 57 which are operated by a switching signal from an output 59 of the pulse generator 39. The switching transistor 55 then connects the output 41 of the delay circuit 3 and hence the capacitor 47 to a first input 61 of an amplifier 63. A second input 65 of the amplifier 63, which input constitutes a difference signal input with respect to the first input 61, is then connected via the switching transistor 57 to a substantially capacitive impedance which is equal to the output impedance of the delay circuit 3 represented by the capacitor 47, and in this Figure by a capacitor 67. The impedance of the capacitor 67 may be rendered, for example, exactly equal to that of the capacitor 47 by imitating the relevant portion of the read switches 21, 23, 25, 27 with their interconnections to the output 41.

The inputs 61, 65 of the amplifier 63 each have a substantially capacitive input impedance which is represented in this Figure by capacitors 69 and 71, respectively. The capacitances of these capacitors 69, 71 are rendered, for example, equal to each other by forming the relevant input circuits of the amplifier 63 in an identical manner.

The output 45 of the read circuit 43 is also the output of the amplifier 63 and is connected to the second input 65 of the amplifier 63 via a series circuit of two identical transistors 73, 75 arranged as capacitors and thus constituting substantially capacitive impedances.

The read circuit 43 also includes a clamping circuit which produces a bias during the period when no video signal is transferred to the output 45, such as, for example, during the line retrace periods. This clamping circuit includes a switching transistor 81 which can connect the first input 61 of the amplifier 63 to the reference voltage source 51, a switching transistor 83 which can connect the output 45 of the amplifier 63 to its second input 65, a transistor 85 which brings the connection of the gate electrodes of the transistors 73 and 75 in the clamping state to a sufficiently high positive voltage so that these transistors always constitute a capacitor, and a transistor 87 which brings a transistor 89 connected to the capacitor 47 and arranged as a capacitor to a sufficiently high positive voltage in the clamping state so that the transistor 89 will always constitute a capacitor. The transistors 81, 83, 85, 87 are operated by a switching signal from an output 91 of the pulse generator 39, which signal brings these transistors to the described state during the clamping periods.

Figure 2:
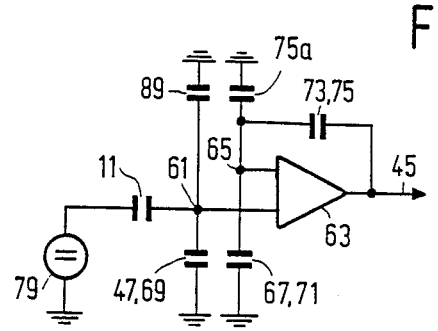
FIG. 2 is a substitution diagram of the read state of the read circuit shown in FIG. 1.

In the operative periods of the sampling circuit 55, 57 the state as shown in the substitution diagram of FIG. 2 occurs, in which the same reference numerals as in FIG. 1 have been used for corresponding elements.

The unloaded voltage across the capacitive memory element 11, which is assumed to be read, is represented by a voltage source 79.

The total capacitance at the first input 61 of the amplifier 63 is constituted by the parallel circuit 47, 69 of the capacitor 47 and the input capacitance 69 of the amplifier 63 which is arranged parallel to the capacitance of the transistor 89 of FIG. 1, and the total capacitance at the second input 65 of the amplifier 63 is constituted by the parallel circuit 67, 71 of the capacitor 67 and the input capacitance 71 of the amplifier 63 which is arranged parallel to the capacitance 75a of the transistor 75 to ground in FIG. 1. These capacitances have been rendered accurately identical to each other by means of the above-mentioned imitation of circuit elements.

The total capacitance 73, 75 between the output 45 and the second input 65 of the amplifier 63 is constituted by the series circuit of the capacitors 73 and 75 of FIG. 1. By imitation of circuit elements constituting the capacitive memory elements of the delay circuit 3, this series circuit has the same capacitance as the capacitive memory element 11.

Since the voltage division from the voltage source 79 to the first input 61 of the amplifier 63 is therefore equal to that from the output 45 to the second input 65 of the amplifier 63, and since the negative feedback signal path from the output 45 to this second input 65 serving as a difference signal input renders the voltage at said second input 65 equal to that at the first input 61, the voltage at the output 45 of the amplifier 63 will be equal to that of the voltage source 79.

Figure 3:
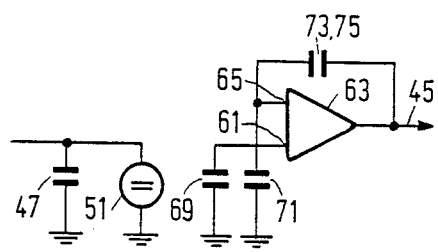
FIG. 3 is a substitution diagram of the hold state of the read circuit shown in FIG. 1.

In the inoperative period of the sampling circuit 55, 57 occurring each time after an operative period, the state occurs as shown in the substitution diagram of FIG. 3 in wich corresponding elements have the same reference numerals as in FIGS. 1 and 2.

Since the voltages at the first input 61 and the second input 65 of the amplifier 63 remain equal, the output voltage of the amplifier 63 does not change so that this amplifier now serves as a hold circuit. The output capacitor 47 of the delay circuit 3 is discharged to the reference voltage of the reference voltage source 51.

Figure 4:
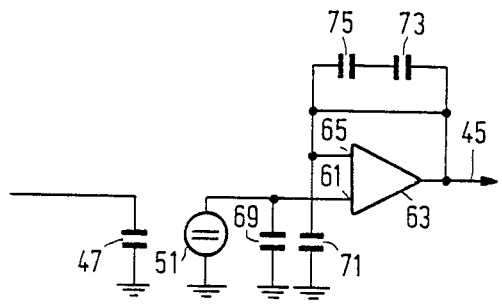
FIG. 4 is a substitution diagram of the clamping state of the read circuit shown in FIG. 1.

In FIG. 4 a substitution diagram shows the state during the clamping periods. Corresponding elements have the same reference numerals as in FIG. 1. The two inputs 61, 65 of the amplifier 63 then assume the reference voltage of the reference voltage source 51.

What is claimed is:

1. A read circuit for a delay circuit for successively reading a plurality of capacitive memory elements of the delay circuit, said reading being delayed with respect to a successive writing of said memory elements and being performed by means of an amplifier an input of which is coupled to an output of the delay circuit, characterized in that the amplifier (63) has a second input constituting a difference signal input with respect to the first-mentioned input, while the first-mentioned input and the second input are coupled via a sampling circuit to the output of the delay circuit and to an impedance, respectively, which is identical to the output impedance of the delay circuit, and the output of the amplifier is coupled via a negative feedback impedance to the second input so that in the operative state of the sampling circuit the negative feedback impedance ensures a voltage division from the output of the amplifier to the input impedance of its second input during reading of a memory element, said voltage division being identical to the voltage division produced by the series circuit of the impedance of a memory element to be read and the parallel circuit of the output impedance of the delay circuit and the input impedance of the first-mentioned input, so that during reading the voltage at the output of the amplifier becomes substantially equal to the unloaded voltage at the relevant memory element and the amplifier serves as a hold circuit when the sampling circuit is inoperative.

2. A read circuit as claimed in claim 1, characterized in that the negative feedback impedance is constituted by a series arrangement of two transistors arranged as capacitors whose gate electrodes can be brought to a sufficiently high voltage via a further transistor during a clamping period.

* * * * *